US009249495B2

(12) United States Patent
Besland et al.

(10) Patent No.: US 9,249,495 B2
(45) Date of Patent: Feb. 2, 2016

(54) METHOD FOR PREPARING A THIN FILM OF THIOSPINELS

(75) Inventors: Marie-Paule Besland, Orvault (FR); Emeline Souchier, Donzere (FR); Laurent Carlo, Nantee (FR); Benoit Corraze, Carquefou (FR); Etienne Janod, La Chapelle sur Erdre (FR); Julie Martial, Lussas et Nontronneau (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 639 days.

(21) Appl. No.: 13/254,727

(22) PCT Filed: Mar. 17, 2010

(86) PCT No.: PCT/EP2010/053442
§ 371 (c)(1),
(2), (4) Date: Nov. 22, 2011

(87) PCT Pub. No.: WO2010/106093
PCT Pub. Date: Sep. 23, 2010

(65) Prior Publication Data
US 2012/0058283 A1    Mar. 8, 2012

(30) Foreign Application Priority Data
Mar. 18, 2009  (FR) ...................................... 09 51744

(51) Int. Cl.
*C23C 14/06* (2006.01)
*C23C 14/34* (2006.01)
*C23C 14/58* (2006.01)

(52) U.S. Cl.
CPC .............. *C23C 14/0623* (2013.01); *C23C 14/34* (2013.01); *C23C 14/5806* (2013.01)

(58) Field of Classification Search
CPC ......... H01L 45/00; H01L 29/12; C23C 14/06; C23C 14/58; C23C 14/34
USPC ............... 427/255.29, 255.31, 419.7, 255.36; 472/255.29, 255.31, 419.7, 79; 428/698
See application file for complete search history.

(56) References Cited

U.S. PATENT DOCUMENTS

| 4,444,615 A * | 4/1984 | Matsuzawa ............... C30B 1/02 117/6 |
| 8,305,794 B2 * | 11/2012 | Cario et al. ................... 365/148 |
| 2010/0065418 A1 * | 3/2010 | Ellmer et al. ............ 204/192.13 |

FOREIGN PATENT DOCUMENTS

| FR | 2913806 A1 | 9/2008 |
| WO | WO/2008/064632 | * 6/2008 |
| WO | WO/2008/113734 | * 9/2008 |

OTHER PUBLICATIONS

Hiramatsu et al, Thin Solid Films 411(2002)125-128.*
(Continued)

*Primary Examiner* — Michael Cleveland
*Assistant Examiner* — Tabassom Tadayyon Eslami
(74) *Attorney, Agent, or Firm* — Thomas Horstemeyer, LLP

(57) ABSTRACT

The invention relates to a method for preparing a thin film of at least one compound of formula $AM_4X_8$, where: A is Ga or Ge; M is V, Nb, Ta or Mo; and X is S or Se. Said method includes the following steps: i) a step of forming a thin film of at least one compound of formula $AM_4X_8$ by the magnetron spraying of a target including at least one compound of said formula $AM_4X_8$, in an atmosphere including at least one inert gas; and ii) a step of annealing the thin film formed during step i) by heat treating; wherein step i) and/or step ii) are carried out in the presence of sulphur when X is S or in the presence of selenium when X is Se.

17 Claims, 4 Drawing Sheets

(56) References Cited

OTHER PUBLICATIONS

V. Weiss et al, Journal of Applied Physics, vol. 95, No. 12(2004), 7665-7633.*

M. Krunks et al, Thin Solid Films 511-512(2006)434-438.*

International Search Report dated Apr. 28, 2010.

Quere, et al., "A Very Simple DC Sputtering Device for Chemistry Laboratory Use", Materials Letters, North Holland Publishing Company, Amsterdam, NL, vol. 3, No. 9-10, Jul. 1, 1985, pp. 340-343.

* cited by examiner

METHOD FOR PREPARING A THIN FILM OF THIOSPINELS

CROSS REFERENCE TO RELATED APPLICATION

This application claims priority to PCT Application entitled "Method for Preparing a Thin Film of Thiospinels," having serial number PCT/EP2010/053442, filed on 17 Mar. 2010, which claims priority to and benefit of French Patent Application No. 0951744, filed on Mar. 18, 2009, which is incorporated by reference in its entirety.

The field of the invention is that of microelectronics.

More specifically, the invention pertains to a method for preparing a thin film of compounds belonging to the family of thiospinels.

As described in the French patent application FR 2 913 806, the inventors of the present application have recently discovered the existence of a phenomenon known as non-volatile and reversible electric-pulse-induced resistive switching (EPIRS) between two states of resistance in a family of compounds in the monocrystalline state, of formula $AM_4X_8$, where:

A represents Ga or Ge;
M represents V, Nb, Ta or Mo; and
X represents S or Se.

These compounds are of great interest in microelectronics for their remarkable properties.

Indeed, these compounds have the advantage of being able to toggle a logic element between two states of electrical resistance with low voltages, especially voltages below 0.1V. These compounds are particularly valuable since can be used to obtain switching times between two states smaller than those of prior-art flash-type memories and may improve integration, i.e. increase the quality of information stored per unit of volume.

These compounds can also be particularly useful as active materials in non-volatile RRAM (Resistive Random Access Memory) type memories as an alternative solution to flash-type memories which have certain limits.

Now the integration of these compounds in a microelectronic device such as a RRAM-type memory requires that they should be deposited as thin films.

At present, there are many techniques for obtaining thin films of different compounds, for example chemical methods, vapor phase deposition methods or again methods based on cathode spraying.

Some of these techniques can be used to obtain thin films of compounds in monocrystal form. These are for example laser ablation or PLD (pulse laser deposition), molecular beam epitaxy or CSD (Chemical Solution Deposition) type chemical techniques based on hydrazine. However, these techniques have certain drawbacks. Indeed, PLD or pulse laser deposition, is ill-suited to the industrial environment especially because of the small deposition surface area obtained by this technique. Besides, very little work has been done on obtaining thin films of chalcogenide compounds (i.e. sulphides or selenides) by molecular beam epitaxy (MBE). Finally, the use of hydrazine raises problems of safety since this is a carcinogenic and volatile solvent.

Certain techniques for their part can be used to obtain thin films of compounds in the form of polycrystals, for example methods based on cathode spraying, especially magnetron spraying.

Magnetron spraying is a special technique of cathode spraying, characterized by the confinement of electrons using a magnetic field close to the surface of a target. This technique has the advantage of making it possible to obtain high spraying speeds and therefore to obtain thin films at high speed. Besides, it is very widespread in industry and is especially compatible with the methods of microelectronics (S. M. Rossnagel Journal of Vac. Sci. Technol. A 21.5, 74 (2003) and Allan Matthews Vac. Sci. Technol. A 21.5. (2003), p. 224).

However, these techniques for obtaining thin films of compounds in the form of polycrystals may modify some of these properties of the compounds as compared with those observed in these compounds in the monocrystalline state. Thus, in particular, magnetron sputtering gives rise to a thin film of the target compound in the form of polycrystals having grain boundaries that could modify the electrical properties of the target compound.

For example, the inventors have highlighted the fact that, although magnetron sputtering makes it possible to obtain thin films of particular compounds, namely lanthanum-substituted bismuth titanate in the form of polycrystals, it modifies the electrical properties of these compounds.

More specifically, the inventors have shown that a technique including especially a step for forming a thin film of lanthanum-substituted bismuth titanate by magnetron sputtering, followed by a step for annealing the thin film thus formed, gives thin films of these compounds in polycrystalline form but causes the loss of the ferroelectric properties of these compounds (Besland et al, "Two-step reactive magnetron sputtering of bit thin films" Journal of Integrated Ferroelectrics (2007) 94-104).

Now, the existence of non-volatile and reversible electrical-pulse induced resistive switching (EPIRS) between two states of resistance disclosed by the inventors in compounds of formula $AM_4X_8$ in the monocrystalline state is likely to be related to the particular crystalline microstructure of these compounds.

The goal of the invention is to be able to have a method that makes it possible to obtain thin films of compounds of formula $AM_4X_8$ while at the same time preserving the properties of these compounds and especially the phenomenon of non-volatile and reversible electric-pulse induced resistive switching (EPIRS) between two states of resistance.

The inventors have discovered that, surprisingly, a thin polycrystalline layer of compounds of formula $AM_4X_8$, obtained by a particular technique based on magnetron sputtering, shows structural and physical properties similar to the properties of these compounds in monocrystalline form. In particular, the inventors have highlighted the fact that, in these thin films, the presence of grain boundaries does not prevent a phenomenon of non-volatile and reversible electric-pulse induced resistive switching (EPIRS) between two states of resistance, previously discovered by the inventors in compounds in the monocrystalline state (as described in the French patent application FR 2 913 806). This result is noteworthy because of the great modification of the electrical properties generally observed in the presence of grain boundaries.

Thus, the inventors have now devised and perfected a method for obtaining thin films of compounds that of formula $AM_4X_8$ and present said phenomenon of non-volatile and reversible electric-pulse induced resistive switching (EPIRS) between two states of resistance.

According to a first aspect, the invention pertains to a method for preparing a thin film of at least one compound of formula $AM_4X_8$ where:

A represents Ga or Ge;
M represents V, Nb, Ta or Mo; and
X represents S or Se;
said method comprising the following steps:

i) a step for forming a thin film of at least one compound of formula $AM_4X_8$ by magnetron sputtering of a target including at least one compound of said formula $AM_4X_8$ in an atmosphere comprising at least one inert gas; and ii) a step for annealing the thin film formed at the step i) by heat treatment;

wherein the step i) and/or the step ii) are implemented in the presence of sulphur when X represents S or in the presence of selenium when X represents Se.

The technique of magnetron sputtering, also known as physical vapor deposition or PVD, is a particular technique of cathode sputtering: the principle of cathode sputtering is based on the setting up of an electrical discharge between two conductive electrodes placed in a chamber in which there prevails a reduced pressure of inert gas and, if necessary, additionally a reagent (a gas that acts in the formation of the thin film) causing the appearance at the anode of a thin film of the compound constituting the antagonistic electrode.

The term "magnetron sputtering" or "magnetron vapor deposition" as understood in the present invention refers to the technique of cathode vapor deposition or cathode sputtering in which electrons are confined by means of a magnetic field close to the surface of a target in a chamber with a prevailing reduced pressure of inert gas and, if necessary, additionally a reagent (in this case a precursor gas of sulphur or selenium). Through the superimposition of a perpendicular magnetic field on the electrical field, the paths of the electrons wind about the magnetic field lines, increasing the chances of ionizing the gas in the vicinity of the cathode. In magnetron sputtering systems, the magnetic field increases the density of the plasma, leading to an increase in the density of the current in the cathode.

In the step i) of the method according to the invention, said target is placed in an atmosphere comprising at least one inert gas in a chamber, said chamber being capable of implementing magnetron sputtering.

There are variants of the magnetron sputtering technique such as ionized magnetron sputtering or pulsed magnetron sputtering. Both these variants can be used in the method of the invention.

Thus, in the method of the invention, the choice of the magnetron sputtering can be made between ionized magnetron sputtering and pulsed magnetron sputtering. These two variants have the advantage of having a higher ionized species content and therefore of having a plasma that is more dense and more efficient, giving higher deposition speeds or again speeds enabling the filling of hollow patterns on a substrate. However, both these variants require high optimization in order to obtain thin films of compounds in crystalline form. Indeed, without high optimization, these two variants tend to amorphize the deposit and may tend result in giving thin film of amorphous materials, doing so even after the annealing step, namely the step ii) of the method of the invention.

Magnetron sputtering has the advantage of making it especially possible to obtain high-sputtering speeds with, in general, a reduction in the temperature of the substrate (S. M. Rossnagel Journal of Vac. Sci. Technol. A 21.5, 74 (2003)).

The pressure of inert gas in a chamber gives a suitable magnetron sputtering efficiency without any incorporation of inert gas into the thin film formed.

In the method according to the invention, said inert gas may be chosen from among helium, neon, argon, krypton, xenon, and preferably argon.

The use of argon in the method of the invention has the advantage of giving satisfactory levels of magnetron sputtering efficiency without any incorporation of argon into the thin film obtained while at the same time being a low-cost method.

In the method of the invention, the step i) and/or the step ii) can be implemented in the presence of sulphur when X represents S or in the presence of selenium when X represents Se, said sulphur or said selenium being possibly present in different forms, namely in native form (elementary sulphur or selenium) or in the form of a sulphur precursor gas or selenium precursor gas respectively.

Implementing the step i) and/or the step ii) in the presence of sulphur when X represents S helps prevent sub-stoichiometric levels of sulphur in the thin film of compounds obtained, said sub-stoichiometric levels being related to the great volatility of sulphur.

Implementing the step i) and/or the step ii) in the presence of selenium when X represents Se helps prevent sub-stoichiometric levels of selenium in the thin film of compounds obtained, said sub-stoichiometry being related to the volatility of selenium Thus, in one particular embodiment of the method of the invention, the step i) and/or the step ii) can be in an atmosphere comprising at least one sulphur precursor gas when X represents S or an atmosphere comprising at least one selenium precursor gas when X represents Se.

Said sulphur precursor gas may be chosen from among the following compounds: hydrogen supplied ($H_2S$), carbon disulphide ($CS_2$) especially hydrogen supplied.

Said selenium precursor gas may be especially hydrogen selenide ($H_2Se$).

Hydrogen sulphide has the advantage of being well suited to use in an industrial environment. Indeed, carbon disulphide is less suitable to use in an industrial environment since it requires high-level safety measures.

According to one particular embodiment of the method according to the invention, the step i) and/or the step ii) can be implemented:

under a flow of sulphur precursor gas or a sulphur-saturated atmosphere when X represents S; or under a flow of selenium precursor gas or in a selenium-saturated atmosphere when X represents Se.

The implementation of the step i) and/or the step ii):

under a flow of sulphur precursor gas or a sulphur-saturated atmosphere when X represents S; or under a flow of selenium precursor gas or in a selenium-saturated atmosphere when X represents Se;

has the advantage of optimizing the restoration of the stoichiometric levels of sulphur or of selenium in the target compound.

The sulphur-saturated atmosphere can be obtained either through a sulphur precursor gas or from elementary sulphur in the gas state, preferably from elementary sulphur in the gas state.

Similarly, the selenium-saturated atmosphere can be obtained either through a selenium precursor gas or from elementary selenium in the gas state, preferably elementary selenium in the gas state.

The sulphur-saturated atmosphere or selenium-saturated atmosphere has an advantage in terms of security and optimizes the restoration of the stoichiometric levels of sulphur or selenium of the target compound.

The advantage of the sulphur precursor gas stream or selenium precursor gas stream is that it is easier to implement in an industrial environment.

The advantage of the use of elementary sulphur or elementary selenium is that it is more practical.

According to one particular embodiment of the invention, the step ii) can be implemented at a temperature of 200 to 850° C., particularly 400 to 750° C. and very particularly 450 to 650° C.

Implementing the step ii) of the method according to the invention at a temperature of 450 to 650° C. has the advantage of being easily reproducible.

According to one particular embodiment of the invention, the step ii) can be implemented for a duration ranging from one minute to 200 hours, particularly ten minutes to 48 hours and very particularly from 30 minutes to 120 minutes.

Implementing the step ii) of the method according to the invention for a duration for a duration or 30 minutes to 120 minutes has the advantage of being compatible with the usual methods of microelectronics.

According to one particular embodiment of the method according to the invention, the step i) can be implemented in an atmosphere where the total gas pressure ranges from 1 to 100 mTorr, and particularly from 10 to 80 mTorr, and very particularly from 40 to 60 mTorr.

Implementing the step i) of the method according to the invention in an atmosphere where the total gas pressure ranges from 40 to 60 mTorr has the advantage of preserving to the utmost the stoichiometric level of the compound in the thin film obtained.

According to one particular embodiment of the invention, the step i) can be implemented in the presence of an electric power generator giving power ranging from 0.1 mW/cm$^2$ to 20 W/cm$^2$, particularly from 0.5 to 2.5 W/cm$^2$ and very particularly from 0.5 to 1.5 W/cm$^2$ of surface area of the target.

Implementing the step i) of the method according to the invention in the presence of an electric power generator giving power ranging from 0.5 to 1.5 W/cm$^2$ of surface area of the target has the advantage of preserving to the utmost the stoichiometric levels of the compound in the thin film obtained.

The distance between the target and the substrate (on which the thin film is deposited) could vary according to the target and the volume of the chamber. For example, the distance between the target and the substrate could range from 2 cm to 7 cm with the target being the compound GaV$_4$S$_8$ in a chamber with a volume of 0.025 m$^3$ (for example 25 cm×25 cm×40 cm) with a target surface area of 78.5 cm$^2$.

According to one particular embodiment of the method of the invention, said target may include at least one compound of formula AM$_4$S$_8$ in which:
A represents Ga or Ge;
M represents V, Nb, Ta or Mo;
in particular, at least one compound of formula GaV$_4$S$_8$.

According to one particular embodiment of the method according to the invention, said step i) may be a step for the formation, on a substrate, of a thin film of at least one compound of formula AM$_4$X$_8$ by magnetron sputtering of a target comprising at least one compound of formula AM$_4$X$_8$ in an atmosphere comprising at least one inert gas.

In particular, said substrate may be chosen from among the silicon-based substrates and in particular substrates comprising a layer of silica on a layer of silicon, substrates comprising a layer of metal on a layer of silicon or again substrates comprising a layer of metal on a layer of silica, said layer of silica being on a layer of silicon.

The present invention also pertains to a device comprising a substrate at least partially coated with a thin film of at least one compound of formula AM$_4$X$_8$, where:
A represents Ga or Ge;
M represents V, Nb, Ta or Mo; and
X represents S or Se;
said thin film being capable of being obtained by the method according to the invention.

The present invention also pertains to a non-volatile resistive memory of the RRAM (Resistive Random Access Memory) type comprising a device according to the invention.

The present invention also pertains to a fuse comprising a device according to the invention.

The present invention also pertains to a switch comprising a device according to the invention.

Other features and advantages of the invention shall appear from the following examples.

These examples are given purely by way of a illustration and non-exhaustively.

EXAMPLES

I. Example 1

Figure 1A:
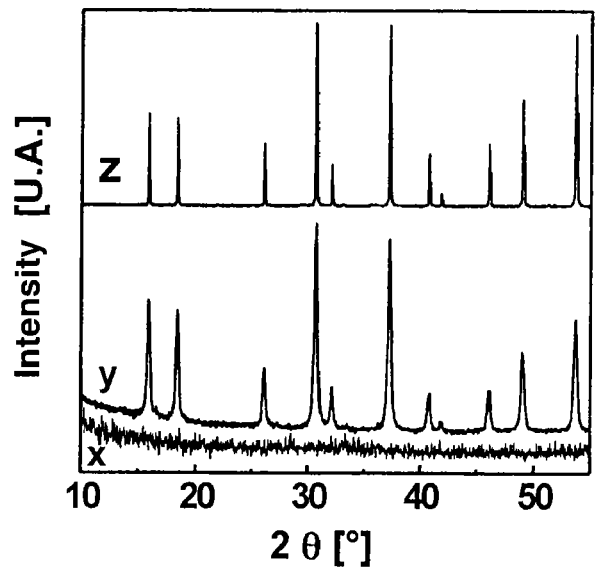
FIG. 1(a) illustrates the graphs obtained by x-ray diffraction on the thin film of the compound GaV$_4$S$_8$, formed at the step i) of the method according to the invention (x), on the annealed layer of the compound GaV$_4$S$_8$ obtained at the step ii) of the method according to the invention (y) as compared with the graph of the polycrystalline powder of the compound GaV$_4$S$_8$ (z).
Figure 1B:
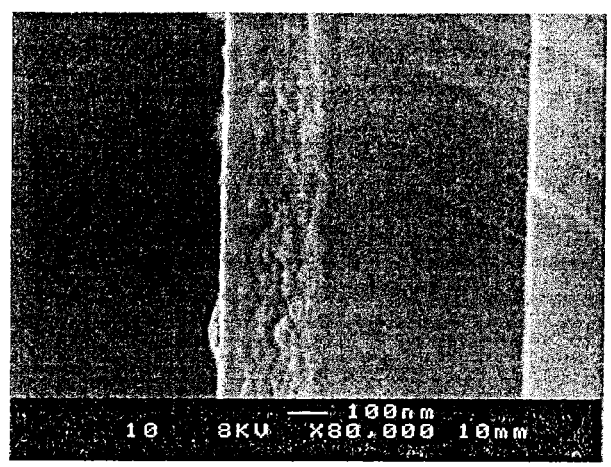
FIG. 1(b) is an image, obtained by scanning electron microscopy, of a cross-section of the thin film of the compound GaV$_4$S$_8$ formed at the step i) of the method according to the invention.

Method for Preparing a Thin Film of the Compound GaV$_4$S$_8$ According to the Invention Step i): The thin films of the compound GaV$_4$S$_8$ had been obtained by RF magnetron cathode sputtering or cathode vapor deposition of argon plasma using a stoichiometric target of the compound.

The deposition chamber is formed by a magnetron cathode with a diameter of 50 mm, equipped with a target of the material having a density 90-95% relative to the theoretical density.

The target was obtained by SPS (spark plasma sintering) also known as FAST (field activated sintering technique)

which is a high-temperature and high-pressure flash sintering technique used to obtain a target of high density without prolonged heating at a temperature below the temperature of decomposition of the material (i.e. lower than 800° C.). The films were deposited on a silicon substrate, or a substrate of silica on silicon, or on a layer of metal on a layer of silicon or again on a layer of metal on a layer of silica, said layer of silica being on a layer of silicon.

The substrate was left at the floating potential, i.e. without any electrical connection to ground. The deposits were made without heating the sample, under pressure ranging from 40 to 80 mTorr for an argon gas flow or stream fixed at 100 sccm and an RF power injected into the target fixed at 0.5 to 1.5 W/cm$^2$.

The thin films of the compound $GaV_4S_8$ obtained after the step i) of the method according to the invention (x), with a thickness of 100 nm to 2 μm, are amorphous and show a sulphur deficit, giving an S/V ratio of 1.1 to 1.5 as compared with the expected ratio of S/V=2, with a stoichiometric ratio of the other elements, i.e. Ga:V=1:4, as determined by EDS (as described in the example 2).

Step ii): After deposition, the thin films formed at the step i) of the method according to the invention, were subjected to annealing in a sulphur-saturated atmosphere (precursor gas $H_2S$ or elementary sulphur making it possible to have a sulphur input during the annealing) at a temperature of 500° C. to 600° C., for a duration of 30 minutes to 120 minutes.

After this step ii), the thin film of the invention (y) has a good chemical composition, i.e. $GaV_4S_8$ and is perfectly crystallized, as verified by x-ray diffraction, with a diffraction pattern similar to that of the compound $GaV_4S_8$ in polycrystalline form (z).

II. Example 2

Characterization of Thin Films Obtained by the Method According to the Invention The thin films obtained according to the method of the invention with the experimental protocol described in Example 1 were analyzed.

II.1 Analysis by Energy-Dispersive X-Ray Spectroscopy (EDS)

Analysis by energy-dispersive x-ray spectroscopy (EDS) showed that the thin film of the compound $GaV_4S_8$ formed at the step i) of the method according to the invention is sulphur deficient if this step i) has not been implemented in the presence of sulphur.

The fact that the step i) and/or the step ii) is implemented in the presence of sulphur makes it possible to restore the stoichiometric level of sulphur in the compound $GaV_4S_8$.

II.2 Analysis by X-Ray Diffraction

The thin films obtained at the step i) and ii) of the method according to the invention, according to the experimental protocol described in the example 1, were analyzed by x-ray diffraction and the graphs thus obtained were compared with the graph for the polycrystalline powder of the compound $GaV_4S_8$ (z).

As can be seen in FIG. 1(a), the thin film of the compound $GaV_4S_8$ formed at the step i) of the method according to the invention (x) shows an amorphous structure.

On the contrary, the thin film, after annealing, of the compound $GaV_4S_8$ obtained at the step ii) of the method according to the invention (y) shows an X-ray diffraction pattern similar to that of the profile of the polycrystalline powder of the compound $GaV_4S_8$.

II.3 Analysis by Scanning Electron Microscopy

The thin films obtained at the step i) and ii) of the method according to the invention according to the experimental protocol described in the example 1 were analyzed by scanning electron microscopy (FIGS. 1 (b) (c) (d))

As shown in FIG. 1 (b), the thin film of the compound $GaV_4S_8$ formed at the step i) of the method according to the invention has a grain morphology or a column morphology.

Figure 1C:
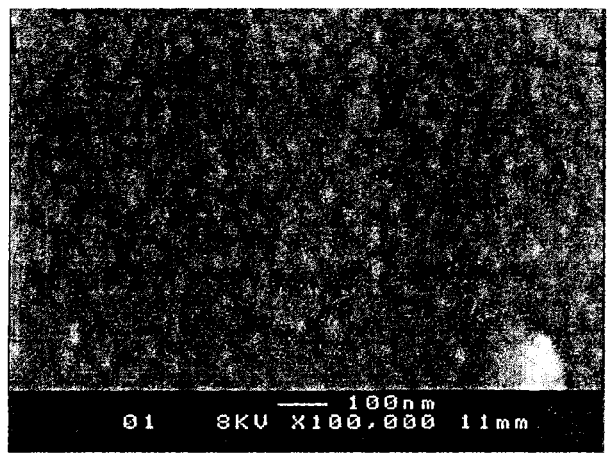
FIG. 1(c) is an image obtained by scanning electron microscopy of a plane view of the surface of the thin film after the annealing of the compound GaV$_4$S$_8$ obtained at the step ii) of the method according to the invention (y).
Figure 1D:
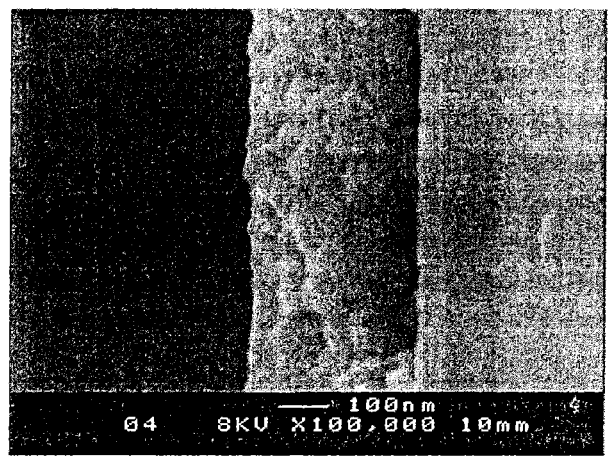
FIG. 1(d) is an image obtained by scanning electron microscopy of a cross-section of the thin film after the annealing of the compound GaV$_4$S$_8$ formed at the step i) of the method according to the invention (y).

The thin film of the compound $GaV_4S_8$ formed at the step ii) of the method of the invention has a grain morphology comprising 30 nm grains (FIGS. 1(c)(d)). This grain size matches the size of the crystallites determined by a refining operation according to the technique described by Rietveld (Rietveld H. M. Acta Crist. 1967, 22, 151. Rietveld H. M. J. Appl. Cryst. 1969, 2, 65.) known to those skilled in the art.

II.4 Analysis by X-Ray Photoelectron Spectroscopy

Figure 2A:
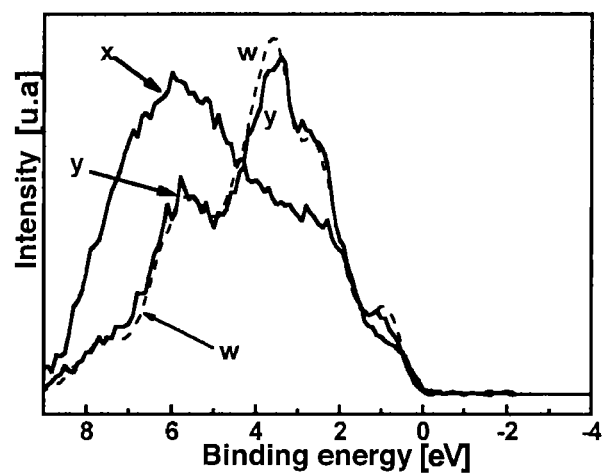
FIG. 2(a) shows a comparison of the valence band spectrum of the compound GaV$_4$S$_8$ in monocrystalline form (w) with that of the thin film of the compound GaV$_4$S$_8$ formed at the step i) of the method according to the invention (x) and that of the thin layer after annealing of the compound GaV$_4$S$_8$ obtained at the step ii) of the method according to the invention (y).

Photoelectron spectroscopy was used to analyze the chemical composition and the valence band of the compound $GaV_4S_8$ in monocrystals form (w), of the thin film of the compound $GaV_4S_8$ formed at the step i) of the method according to the invention (x), of the thin film after annealing of the compound $GaV_4S_8$ obtained at the step ii) of the method according to the invention (y) (FIG. 2(a)).

As can be seen in FIG. 2(a), the thin film of the compound $GaV_4S_8$ formed at the step i) of the method according to the invention (x) presents a valence band spectrum that is very different from that of the compound $GaV_4S_8$ in monocrystal form (w).

On the contrary, the annealed thin film of the compound $GaV_4S_8$ obtained at the step ii) of the method according to the invention (y) presents a valence band spectrum very similar to that of the compound $GaV_4S_8$ in monocrystal form.

II.5 Analysis by Magnetic Measurement

Figure 2B:
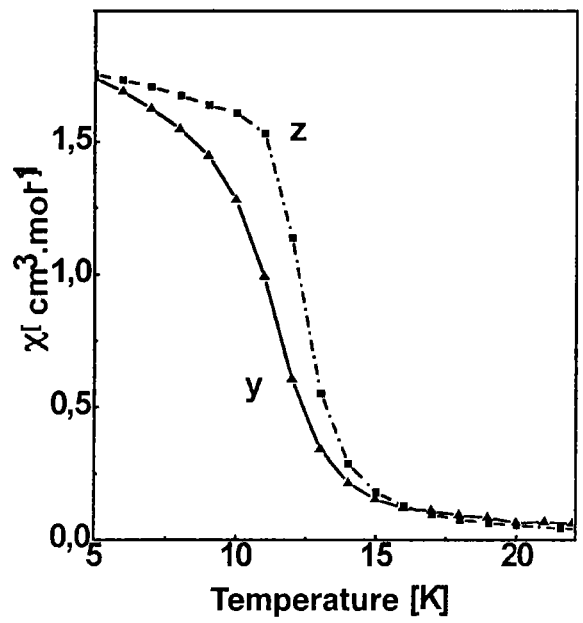
FIG. 2(b) represents the magnetic susceptibility, as a function of temperature, of the compound GaV$_4$S$_8$ in polycrystalline form (z), of the thin film after annealing of the compound GaV$_4$S$_8$ obtained at the step ii) of the method according to the invention (y).

The magnetic susceptibility, as a function of temperature, of the compound $GaV_4S_8$ in polycrystalline form (z) and of the annealed thin film of the compound $GaV_4S_8$ obtained at the step ii) of the method according to the invention (y) was analyzed with an applied field of 1000 Gauss (FIG. 2(b)).

As can be seen in FIG. 2(b), the ferromagnetic transition appears at the same temperature for the compound $GaV_4S_8$ in polycrystalline form (z) and for the annealed thin film of the compound $GaV_4S_8$ obtained at the step ii) of the method according to the invention (y).

II.6 Conclusions

All these analyses described here above (II.1 to II.5) show that the thin film of the compound $GaV_4S_8$ obtained according to the method of the invention has the same electronic properties as the compound $GaV_4S_8$ in monocrystal form.

III. Example 3

Highlighting the Phenomenon of Non-Volatile and Reversible Electrical Pulse-Induced Resistive Switching (EPIRS) Between Two Resistance States in Thin Films According to the Method of the Invention The thin films obtained according to the method of the invention with the experimental protocol described in FIG. 1 were analyzed relatively to the phenomenon of non-volatile and reversible electrical pulse-induced resistive switching (EPIRS) between two resistance states.

The tests were made on Au/GaV$_4$S$_8$/Au/Si type structures in which a thin film of the compound GaV$_4$S$_8$ obtained according to the method of the invention covers a substrate comprising a layer of gold on a silicon substrate or a layer of silica on a silicon substrate, said thin film being itself covered with a layer of gold.

The device consists of two contact points on either side of the thin film of the compound GaV$_4$S$_8$, i.e. in the layers of gold.

The resistance of the thin film of the compound GaV$_4$S$_8$ was measured as a function of temperature, with a low level of voltage ($10^{-2}$ to $10^{-5}$ V) in the initial state of high resistance and in the state of low resistance after resistive transition. At 300 K, the ratio between the resistance values of the high and low levels is of the order 10 ($R_{high}$=100Ω and $R_{low}$=10Ω), giving potentially a variation of 90% in the level of resistance, which is particularly well suited to applications in microelectronics.

Figure 3:
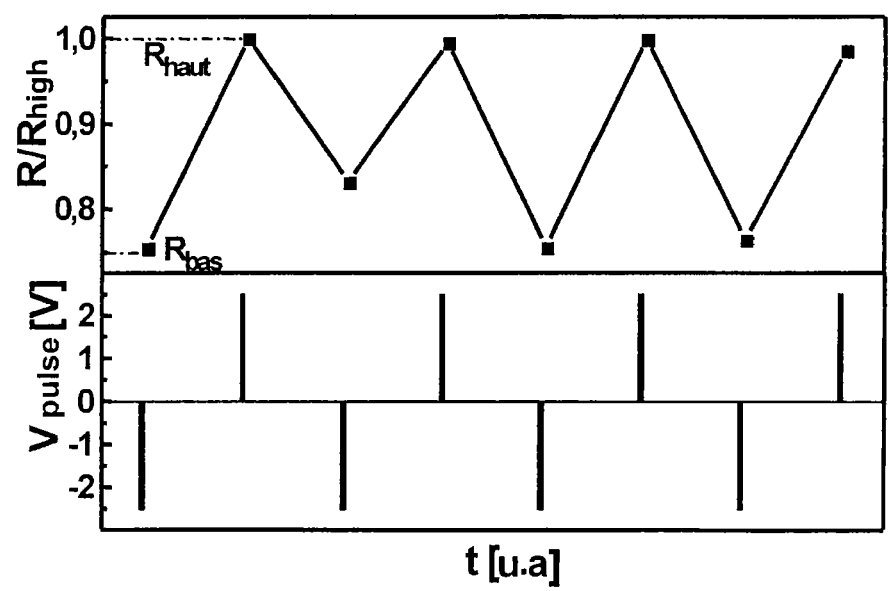
FIG. 3 represents the phenomenon of non-volatile and reversible electric pulse-induced resistive switching (EPIRS) between two states of resistance measured on an annealed thin film of the compound GaV$_4$S$_8$ obtained at the step ii) of the method according to the invention (y) at 300K with 10 µs pulses for voltages of +/−2.5V.

Pulses of +2.5V and −2.5V with a duration of 10 μs were applied alternately to the device at 300K and the resistance of the thin film was measured after each pulse with a voltage of $10^{-3}$V. As can be seen in FIG. 3, a non-volatile variation of the resistance was measured after each voltage pulse (positive or negative). A relative variation in the resistance (($R_{high}$−$R_{low}$)/$R_{high}$) of about 25% was thus observed.

For pulses with a duration of 25 ms and for lower voltages of +1.5V and −1.5V, the effect is also observed. Thus, 300 cycles between the two states of electrical resistance were observed without any effect of fatigue on the device.

All these pieces of experimental data clearly show that thin films of the compound GaV$_4$S$_8$ obtained according to the method of the invention show the same phenomenon of non-volatile and reversible electrical pulse-induced resistive switching (EPIRS) between two states of resistance as is the case with the compound GaV$_4$S$_8$ in monocrystalline form (w).

The method of the invention also provides thin films of compounds with the formula AM$_4$X$_8$, especially the compound GaV$_4$S$_8$, which have the same structural and physical properties and especially the same phenomenon of electrical pulse-induced resistive switching (EPIRS) as the compound GaV$_4$S$_8$ in monocrystalline form.

The method of the invention is therefore particularly valuable for obtaining thin films of compounds of formula AM$_4$X$_8$ which could have applications in microelectronics, especially in RRAM type memories.

The invention claimed is:

1. A method for preparing a thin film of at least one compound of formula AM$_4$X$_8$ intended to be used as active material for a storage memory where:
   A represents Ga or Ge;
   M represents V, Nb, Ta or Mo; and
   X represents S or Se;
   said method comprising the following steps:
   i) a step of forming a polycrystalline thin film of at least one compound of said formula AM$_4$X$_8$ by magnetron sputtering from a target including at least one compound of said formula AM$_4$X$_8$ in an atmosphere comprising at least one inert gas; and
   ii) a step of annealing the thin film by heat treatment, wherein at least one of the step i) or the step ii) are implemented in the presence of sulphur when X represents S or in the presence of selenium when X represents Se.

2. The method according to claim 1, wherein at least one of the step i) or the step ii) are implemented in an atmosphere comprising at least one sulphur precursor gas when X represents S or an atmosphere comprising at least one selenium precursor gas when X represents Se.

3. The method according to claim 1, wherein at least one of the step i) or the step ii) are implemented:
   under a flow of sulphur precursor gas or a sulphur-saturated atmosphere when X represents S; or
   under a flow of selenium precursor gas or in a selenium-saturated atmosphere when X represents Se.

4. The method according to claim 1, wherein the step ii) is implemented at a temperature of 200 to 850° C.

5. The method according to claim 1, wherein the step ii) is implemented at a temperature of 400 to 750° C.

6. The method according to claim 1, wherein the step ii) is implemented at a temperature of 450 to 650° C.

7. The method according to claim 1, wherein the step ii) is implemented for a duration ranging from one minute to 200 hours.

8. The method according to claim 1, wherein the step ii) is implemented for a duration ranging from 10 minutes to 48 hours.

9. The method according to claim 1, wherein the step ii) is implemented for a duration ranging from 30 minutes to 120 minutes.

10. The method according to claim 1, wherein the step i) is implemented in an atmosphere of a total gas pressure ranges from 1 to 100 mTorr.

11. The method according to claim 1, wherein the step i) is implemented in an atmosphere where a total gas pressure ranges from 10 to 80 mTorr.

12. The method according to claim 1, wherein the step i) is implemented in an atmosphere where a total gas pressure ranges from 40 to 60 mTorr.

13. The method according to claim 1, wherein the step i) is implemented in a presence of an electric power generator giving power ranging from 0.1 to 20 W/cm$^2$.

14. The method according to claim 1, wherein the step i) is implemented in a presence of an electric power generator giving power ranging from 0.5 to 2.5 W/cm$^2$.

15. The method according to claim 1, wherein the step i) is implemented in a presence of an electric power generator giving power ranging from 0.5 to 1.5 W/cm$^2$ of surface area of the target.

16. The method according to claim 1, wherein said target includes at least one compound of formula AM$_4$S$_8$ where:
   A represents Ga or Ge; and
   M represents V, Nb, Ta or Mo.

17. The method according to claim 1, wherein said target includes at least one compound of formula GaV$_4$S$_8$.

* * * * *